US010491329B1

(12) United States Patent
Davis et al.

(10) Patent No.: US 10,491,329 B1
(45) Date of Patent: Nov. 26, 2019

(54) TRANSFER OF DATA-REDUNDANCY ENCODED DATA VIA UNRELIABLE, CONNECTIONLESS PROTOCOL

(71) Applicant: Amazon Technologies, Inc., Seattle, WA (US)

(72) Inventors: Melissa Elaine Davis, Edmonds, WA (US); Jeremy Boynes, Mercer Island, WA (US); Charles Alexander Carman, Seattle, WA (US); Paul Derek DeMarco, Seattle, WA (US); Mark Noel Kelly, Seattle, WA (US); Christopher Allen Suver, Seattle, WA (US); Alexander Julian Tribble, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 125 days.

(21) Appl. No.: 15/373,341

(22) Filed: Dec. 8, 2016

(51) Int. Cl.
*H04L 1/00* (2006.01)
*G06F 11/10* (2006.01)
(Continued)

(52) U.S. Cl.
CPC ............ *H04L 1/0041* (2013.01); *G06F 11/10* (2013.01); *H03M 13/154* (2013.01);
(Continued)

(58) Field of Classification Search
CPC ..... H04L 1/0041; H04L 69/16; H04L 1/0075; H04L 1/0058; H04L 1/10; H03M 13/154; G06F 11/10
See application file for complete search history.

(56) References Cited

U.S. PATENT DOCUMENTS

| 2008/0158333 | A1* | 7/2008 | Krisbergh | ............ H04N 19/115 348/14.01 |
| 2009/0080423 | A1* | 3/2009 | Ewing | ................... H04L 1/0014 370/389 |

(Continued)

OTHER PUBLICATIONS

Ed. Stewart, R., "Stream Control Transmission Protocol", dated Sep. 2007, pp. 1-304.

(Continued)

*Primary Examiner* — Thien Nguyen
(74) *Attorney, Agent, or Firm* — Robert C. Kowert; Meyertons, Hood, Kivlin, Kowert & Goetzel, P.C.

(57) ABSTRACT

A system for transmitting data over a network may include data processed according to a data-redundancy encoding technique such as erasure coding to be transmitted via an unreliable, connectionless transmission protocol, for example user datagram protocol ("UDP"). A transmitting manager may receive a request from an application to transmit data. The transmission manager may select encoding parameters and encode data to be transferred using a data-redundancy encoding technique. The transmission manager may initiate transmission of the encoded data and payload header data may via a network, for example via a network communication stream or protocol stack. A reconstruction manager associated with the receiving node may reconstruct the original data using the received erasure coding data and payload header data. In some embodiments, the receiving node may transmit telemetry data to the erasure coding algorithm. The erasure coding algorithm may use received telemetry data to adjust parameters of the erasure coding algorithm for future erasure coding and transmission operations. In some systems, telemetry data may include a request to retransmit all or a portion of the erasure coded data.

20 Claims, 7 Drawing Sheets

(51) Int. Cl.
*H03M 13/15* (2006.01)
*H04L 29/06* (2006.01)

(52) U.S. Cl.
CPC .......... *H04L 1/0058* (2013.01); *H04L 1/0075* (2013.01); *H04L 69/16* (2013.01)

(56) References Cited

U.S. PATENT DOCUMENTS

| | | | | |
|---|---|---|---|---|
| 2014/0281817 A1* | 9/2014 | Grube | ................ | G06F 11/1076 |
| | | | | 714/769 |
| 2014/0317224 A1* | 10/2014 | Resch | ................ | G06F 11/1076 |
| | | | | 709/213 |
| 2015/0181460 A1* | 6/2015 | Subramanian | ........ | H04L 1/0009 |
| | | | | 370/230 |
| 2016/0323062 A1* | 11/2016 | Yang | ................ | H03M 13/154 |
| 2017/0006075 A1* | 1/2017 | Li | ........................ | H04L 12/14 |
| 2017/0031761 A1* | 2/2017 | Horan | ................ | G06F 16/122 |

OTHER PUBLICATIONS

Sai Rohan et al, "Transmission Control Protocol", dated 2014, (https://tools.ietf.org/html/rfc4960), pp. 1-12.

\* cited by examiner

| PARAMETER | VALUE |
|---|---|
| type of source name | (bit array for type of source, e.g. IPv4/mask, IPv6/mask, FQDN) |
| source field | (source host identifier e.g. IPv4, IPv6, FQDN hostname) |
| total erasure-coded message length (n) | (in bytes) |
| length of message before EC (m) | (in bytes) |
| number of EC shards | (number of the last fragment- fragment #s sequential by integer) |
| ratio of n/m | (integer indicating percentage- indicator of parity) |
| wait time before FIN/ACK | (how long sender will wait for FIN/ACK or telemetry before resend) |
| time stamp of send | (application time sent) |

FIG. 6

TRANSFER OF DATA-REDUNDANCY ENCODED DATA VIA UNRELIABLE, CONNECTIONLESS PROTOCOL

BACKGROUND

Modern networking applications require transfer of large amounts of data. Over time, the need transfer large amounts of data efficiently continues to increase. Traditionally, applications and services requiring reliable transfer of data have relied on transmission control protocol ("TCP") connections. However, TCP connections require significant overhead, for example in the form of session establishment and maintenance, acknowledgement of each packet, window flow control, duplicate packet retransmission, robust error correction, etc.

TCP was designed to provide reliable delivery over unreliable networks, packet fragmentation, and to ensure flow control between endpoints differing considerably in compute capability. To provide these features, TCP establishes virtual connections carrying unstructured byte streams, buffered transfer, and full duplex communication, and provide congestion control with packet re-transmissions. TCP provides for sliding windows to equalize the ability of a receiver and a sender's capacity or to compensate for packet loss in the network (congestion control and congestion avoidance). Additionally, TCP has evolved many times, continually increasing complexity, for example in its congestion control algorithms. Delay remains a problem for TCP, which is dependent on various computations of Round Trip Time ("RTT") in measuring when to retransmit after failure to receive acknowledgments. TCP was invented on assumptions of reliability-hostile networks, and provides robustness at a price of complexity, speed, resource usage.

A common alternative transmission method to TCP is user datagram protocol ("UDP"). UDP and other unreliable or connectionless transmission protocols typically result in a much lower-latency connection than TCP, and UDP connections are particularly adapted to situations where some loss of data may be tolerated. A typical unreliable, connectionless protocol may drop data without acknowledgement to a sender or network layer. UDP provided data transmission without the TCP's guarantees against loss, and is typically considered most useful over reliable, low-loss networks such as Local Area Networks ("LANs"), and similar networks, for example networks that share administrative resources.

Web-based application, cloud computing, and other network and Internet based technologies are area frequently requiring transfer of large amounts of data with needs for durability and efficiency. The conventional Web model allows clients to access Web resources (e.g., applications, services and data) via an HTTP client program, such as a Web browser. A technology referred to as Web services has been developed to provide programmatic access to Web resources. Web services may be used to provide programmatic access to Web resources including technology platforms (e.g., applications and services) and data (e.g., product catalogs and other databases) hosted on Web-connected computers such as Web server systems via a Web service interface. Generally speaking, a Web service interface may be configured to provide a standard, cross-platform API (Application Programming Interface) for communication between a client requesting some service to be performed and the service provider. In some implementations, a Web service interface may be configured to support the exchange of documents or messages including information describing the service request and response to that request. Such documents, or messages, may be exchanged using standardized Web protocols, such as the Hypertext Transfer Protocol (HTTP), for example, and may be formatted in a platform-independent data format, such as eXtensible Markup Language (XML), for example. A web services or other provider network may typically be supported by one or more physical and virtual operator-owned data centers.

Operator-owned data centers typically include networks having little congestions, few dropped or lost packets, and relatively uniform storage systems. Similar characteristics may exist within data center clusters, in long-haul transmissions between remote data centers, and between data centers and their content delivery network endpoints, for example. These characteristics make such environments good candidates for applying unreliable, connectionless transmission such as UDP, but for their low tolerance for data loss. Improvements to present data transfer systems and methods are desirable to provide low-latency, low-data-loss transfer of data.

BRIEF DESCRIPTION OF THE DRAWINGS

FIG. 6 is a table showing example payload header data that may be used to implement transmission of data-redundancy encoded data.

Figure 1:
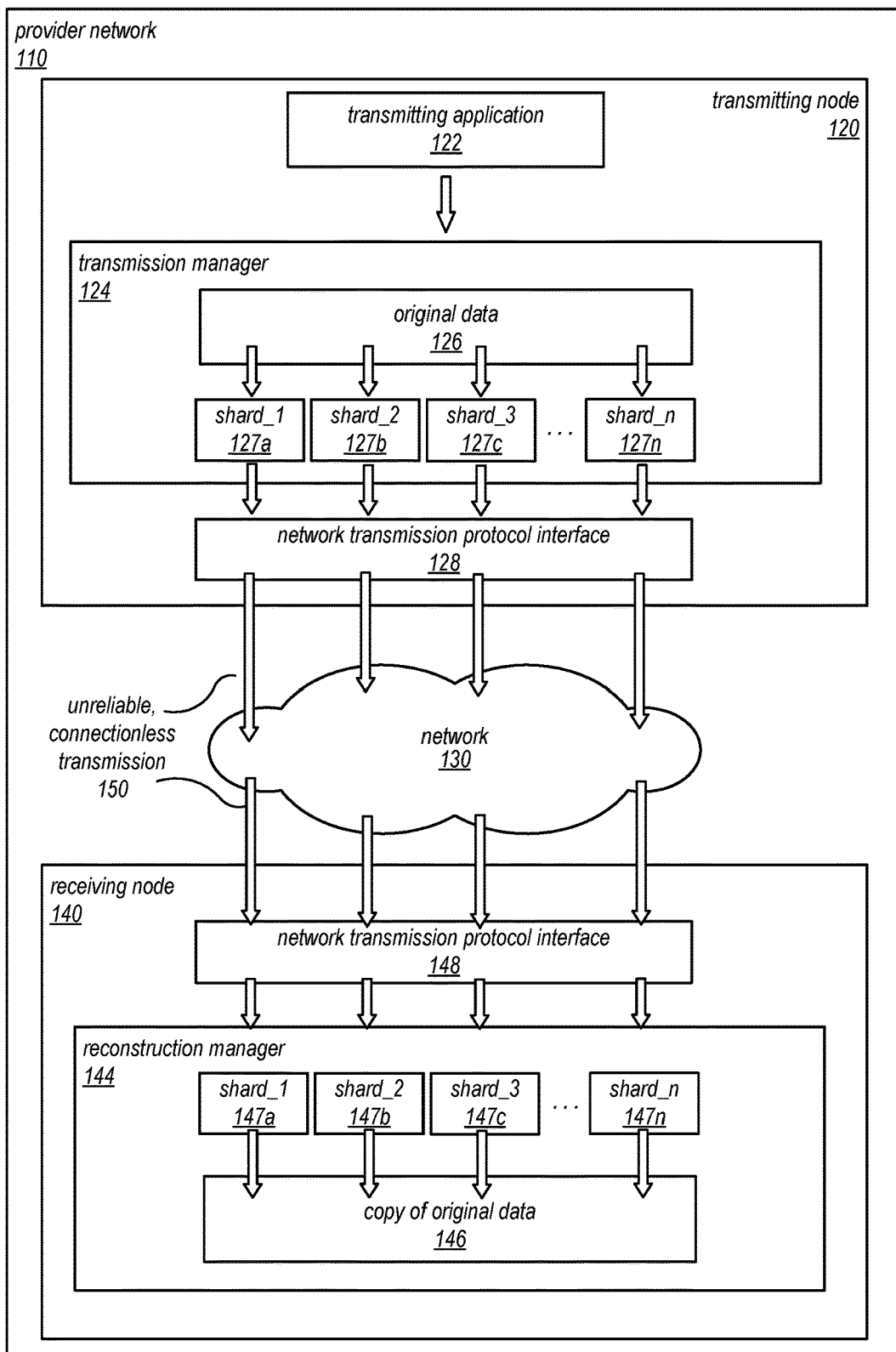
FIG. 1 is a high-level block diagram of a system for transferring data-redundancy encoded data.

While embodiments are described in this application by way of example for several embodiments and illustrative drawings, those skilled in the art will recognize that embodiments are not limited to the embodiments or drawings described. It should be understood, that the drawings and detailed description thereto are not intended to limit embodiments to the particular form disclosed, but rather, to cover numerous modifications, equivalents, and alternatives falling within the spirit and scope as defined by the appended claims. The headings used in this application are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include", "including", and "includes" mean including, but not limited to.

DETAILED DESCRIPTION

Various data-redundancy encoding techniques may be useful for transmitting data with more efficiency than is possible using common TCP/IP protocols, particularly over reliable or predictable network connections. For example, a mature technology called erasure coding has been applied extensively within large storage systems because it attains a high fault tolerance against loss without the strict requirements of replication. Erasure coding involves augmenting a dataset by adding redundant information and fragmenting the augmented dataset. The original dataset can then be recovered using a subset of the fragments (sometimes called "shards").

Low-latency networks may be inordinately affected by onerous operational overhead requirements of TCP data transfer. Such networks may benefit from UDP-style transmission, but still require protection against data loss not offered by traditional UDP schemes. In such networks, erasure coding of data to before transmission over a UDP connection may allow low-latency, reliable data transmission while removing costly anti-loss operations—typically performed by TCP in kernel space—into user space. For example, a node of a web services system may implement erasure coding before transmission of data. In other examples, a network may have separate resources dedicated to erasure-coded transmission, such as servers or virtual processors.

Upon receiving erasure-coded data, a receiving node may reconstruct the data using typical erasure decoding techniques. The receiving node may additionally send telemetry data to the transmitting node. For example, the receiving node may send network latency, requests for adjustments to an encoding scheme, requests for retransmittal, or other information that would be useful to the transmitting node to make adjustments to its erasure coding algorithm.

In some embodiments, a node or module of a system described herein may receive a request for data. The system or node may be configured to encode or encrypt the data according to a redundant encoding technique such as erasure encoding. For example, the storage manager may encrypt the data object into a plurality of "fragments" and transmit each fragment. Each shard may be stored on a different data storage device (e.g., to provide additional failure protection). At a future time, some or all of the shards may be used to reconstruct the original data object using a decoding matrix. The decoding matrix may be generated based on the encoding matrix.

Data-redundancy encoding, including erasure encoding, includes creating a mathematical function to describe a set of numbers such that the set can be checked for accuracy and corrected in the event of loss. As a non-limiting example, an erasure encoding scheme may be used in which additional data (e.g., redundant data) may be added to a data object to create an expanded data object. The expanded data object may be divided into n shards. However, in this example, only k shards are necessary to recreate the data object. As just one specific example, an erasure encoding scheme may be used in which 20 shards are generated for a data object (n=20), and 10 shards are required to recreate the data object (k=10). As another example, an erasure encoding scheme may be used in which 40 shards may be generated for a data object (n=40), with 10 shards required to recreate the data object (k=10). Note that, even if shards are lost from a storage system that implements the redundant encoding scheme, if at least k shards remain, generally no data is lost, as the remaining shards should include sufficient information to recreate the data object (e.g., the original data object).

In a simple erasure coding scheme, the protection can be represented by the equation n=k+m, where "k" is the original amount of data or symbols and "m" represents the extra or redundant symbols added to provide protection from failures. In the equation above, "n" represents the total number of symbols created after the erasure coding process.

FIG. 1 is a high-level block diagram of a system for transferring data-redundancy encoded data. A provider network 110, for example, a provider network of a web services platform or virtual computing service, may include various computing devices or nodes. A transmitting node 120 of provider network 110 may be associated with data to be transferred.

Transmitting application 122 may send a request for transmission of particular identified data. In some embodiments the request from transmitting application 122 may be in the form of a standard application call to a network protocol—for example, where transmission application 122 is agnostic or unaware of a system's capability to implement transmission of data using data-redundancy encoding and an unreliable, connectionless transmission protocol. In some embodiments, transmitting application 122 may specify a preference or demand for the transmission of data to be accomplished using data-redundancy encoding or an unreliable, connectionless protocol.

Transmission manager 124 may receive the request to transfer data from transmitting application 122. In some embodiments, the request may be specifically directed to transmission manager 124. In other embodiments, transmission manager 124 may intercept the request—for example, where transmitting application 122 is unaware of or agnostic to a system's capability to implement transmission of data using data-redundancy encoding and an unreliable, connectionless transmission protocol, the application 122 may make a standard request which may be intercepted by transmission manager 124 in a system where a designer or manager has chosen to implement the feature(s).

Transmission manager 124 may determine, based on various conditions, that the data may be efficiently transmitted by encoding it using a data-redundancy encoding technique and broadcasting or transferring the data over an unreliable transmission protocol. For example, transmitting application 122 may request such a transmission mode. In other embodiments, the mode of transmission may be effectively invisible to the requesting application or the transmission manager may determine on its own to use a data-redundancy encoding technique. For example, where predefined conditions are met, the transmission manager 124 may automatically intercept a request and implement data-redundancy encoding of the data to be transmitted or transmission via an unreliable, connectionless protocol such as UDP.

Transmission manager 124 selects parameters of a data-redundancy encoding technique or algorithm. For example, transmission manager 124 may select parameters based on network conditions such as one or more expected or measured packet or data loss rates or measured or expected latency on a network. These metrics for network conditions may be estimated or calculation using a variety of techniques known to one having ordinary skill in the art, or in some cases observed from previous transmissions on the network, including transmissions of data-redundancy encoded data over the network. In some embodiments, transmission manager 124 may select parameters of an algorithm based at least in part on characteristics of the data itself, such as the amount or complexity of data to be transferred. In some embodiments, one or more parameters may be preconfigured, for example by an owner or operator of a provider network within which the transfer is to take place. In some embodiments, transmission manager may select among a plurality of pre-defined sets of parameters, for example, sets of parameters representing known, predefined erasure-coding algorithms as may be apparent to one having ordinary skill in the art. Examples of specific parameters that may be selected are discussed further below with respect to FIG. 6.

Having selected parameters of a data-redundancy encoding technique or algorithm, transmission manager processes original data 126 according to the algorithm or technique. In various embodiments, original data 126 may be received directly from a transmitting application, or from another source, for example a data store associated with provider network 110. In an example embodiment involving applying an erasure coding scheme, transmission manager 126 may augment original data 126 with redundant data and break the augmented data in to encoded data shards 127a-n, as described in further detail above and apparent to one having ordinary skill in the art including knowledge of erasure coding methods.

As explained above, data shards 127a-n may represent an augmented version of original data 126. Data shards 127 may be coded according to an erasure coded technique or according to another coding technique. Original data 126 can be reconstructed from a particular number of shards. In some embodiments, the particular number of shards is fewer than a total number of shards representing data 126 or another data object.

In some embodiments, transmission manager 124 may append to, prepend to, or embed within one or more shards 127 payload header data (not specifically shown at FIG. 1). For example, payload header data may include one or more of the selected parameters of a data-redundancy encoding algorithm as described above. In some embodiments, payload header data may include information necessary for decoding shards 127 and reconstructing original data 126. For example, payload header data may include information about a total number of shards 127 representing original data 126, how many shards are needed to reconstruct original data 126, sequential numbering of shards 127, or a combination of those elements, in addition to other information.

Transmission manager 124 may initiate a call to network transmission protocol interface 128 for transmission of data shards 127a-n. In various embodiments, network transmission protocol interface 128 may comprise a standard network protocol interface, for example a standard TCP/IP or UDP interface. In some embodiments, an example network transmission protocol interface may be configured specifically to handle transmission of data-redundancy encoded data via an unreliable, connectionless protocol. Network transmission protocol interface 128 may be implemented in whole or in part, for example, by a library of transmitting node 120 or provider network 110. In some embodiments, a network transmission protocol interface may be implemented in whole or in part by elements identical or similar to a protocol stack, a network layer, a transport layer, or a data streaming protocol, or any combination of such elements or similar elements as would be apparent to one having ordinary skill in the art.

In some embodiments, transmission manager 124 may specify an unreliable, connectionless protocol when calling interface 128. In other embodiments, transmission manager 124 may make a standard call, and interface 124 may determine on its own—for example, by analyzing payload header data or the data shards themselves—that the transmission should be done using an unreliable, connectionless protocol.

Network transmission protocol interface 128 may initiate transmission of shards 127a-n via network 130 to a receiving node 140 via an unreliable, connectionless transmission 150. In various embodiments, the network 130 may encompass any suitable combination of networking hardware and protocols necessary to establish transmission between nodes of provider network 110. For example, the network 130 may include physical or virtual hardware (e.g., modems, routers, switches, load balancers, proxy servers, etc.) and software (e.g., protocol stacks, accounting software, firewall/security software, etc.) necessary to establish a transmission link between transmitting node 120 and receiving node 140. In some embodiments, various components or nodes of provider network 110 may communicate via a private network (e.g. a LAN or WAN) that is not publicly accessible, but may use known communication protocols including typical internet-based protocols such as TCP/IP or unreliable, connectionless protocols such as UDP.

A network transmission protocol interface 148 of receiving node 140 according to some embodiments may handle receipt at receiving node 140 of incoming encoded data shards 127a-n. Network transmission protocol interface 148 may be similar or identical in function and capabilities to network transmission protocol 128 of transmitting node 120. Network transmission protocol 140 of receiving node 140 may relay incoming encoded data shards to a reconstruction manager 144 in the form of shards 147a-n as shown at FIG. 1.

Reconstruction manager 144 according to some embodiments uses the data of received shards 147 and payload header data associated with shards 147 to decode shards 147a-n and reconstruct a copy of original data 146. For example, payload header data associated with shards 147 may indicate or allow reconstruction manager 144 to calculate information such how many total shards there are, how many shards are needed to completely reconstruct a copy of the original data, when a shard was transmitted, information about how the transmission manager will handle errors or retransmissions, how long the transmission manager will wait for acknowledgement from reconstruction manager 144, etc. According to some embodiments, reconstruction manager 144 will apply appropriate decoding techniques depending on the data-redundancy encoding technique used by transmission manager 124 to create the encoded data shards. For example, if shards 147 are encoded according to an erasure encoding scheme, reconstruction manager may apply a decoding matrix, refinement techniques, and other decoding techniques as would be apparent to one having ordinary skill in the art.

In some embodiments, encoded data shards 147 may be numbered, sequentially or according to another scheme, to allow reconstruction manager 144 to determine whether it has received all expected shards or enough expected shards to reconstruct a copy of original data 146, and if not, how many shards it did not receive and which particular shards are missing. According to some embodiments, payload header data associated with shards 147 may include identification of each shard. According to some embodiments, reconstruction manager 144 may send acknowledgements or messages to to transmission manager 124 or transmission node 120 generally, for example, when it has received enough shards to reconstruct original data, when it has received all expected shards, or when it has successfully reconstructed a copy of original data 146.

In some embodiments, reconstruction manager 144 may send additional messages to transmission manager 144, for example in the form of telemetry information. Telemetry information according to some embodiments may include a request to resend all shards or some particular shards, network latency or dropped packet information, information about one or more data loss events, requests for adjustments to algorithm parameters for retransmission or future transmissions, requests for load reduction or other adjustments, etc.

Figure 2:
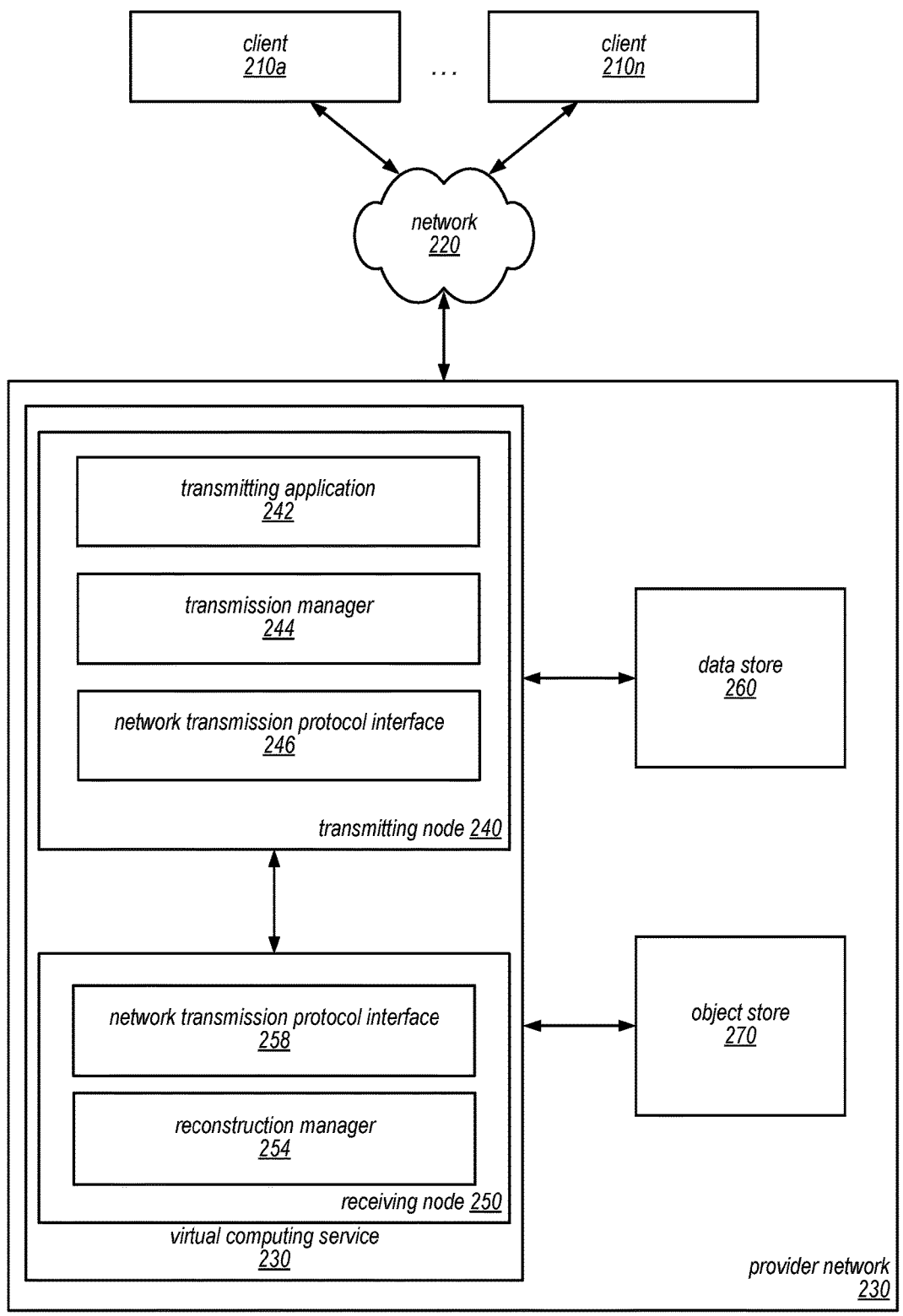
FIG. 2 is a block diagram illustrating a service system architecture that may be configured to implement transmission of data-redundancy encoded data.

FIG. 2 is a block diagram illustrating a service system architecture that may be configured to implement transmission of data-redundancy encoded data via an unreliable, connectionless transmission protocol. One embodiment of a service system architecture that may be configured to implement transfer of erasure-coded data in a web-services based system is shown in FIG. 2. In the illustrated embodiment, a number of clients (shown as clients 210a-210n) may be configured to interact with a virtual computing service or virtual computing service 230 via a network 220. The virtual computing service 230 may be configured to interface with one or more instances of a data store 260, an object store 270, and/or various other services or applications.

In various embodiments, the components illustrated in FIG. 2 may be implemented directly within computer hardware, as instructions directly or indirectly executable by computer hardware (e.g., a microprocessor, a computer system, or one or more hardware processors), or using a combination of these techniques. For example, the components of FIG. 2 may be implemented by a distributed system including a number of computing nodes (or simply, nodes), such as the computer system embodiment shown in FIG. 7 and discussed below. In various embodiments, the functionality of a given service system component (e.g., a storage service system component) may be implemented by a particular node or distributed across several nodes. In some embodiments, a given node may implement the functionality of more than one service system component (e.g., more than one storage service system component).

In general, clients 210a-n may be agnostic or unaware of a virtual computing service's capability to transmit data using a data-redundancy encoding technique and unreliable, connectionless transmission protocol. In some embodiments, the clients 210a-n may encompass any type of client configurable to submit requests to the virtual computing service 230 via the network 220, including requests for data transfer or storage services. For example, a given client 210a may include a suitable version of a web browser, or a plugin module or other type of code module configured to execute as an extension to or within an execution environment provided by a web browser. Alternatively, a client 210 (e.g., a transmitting or receiving node) may encompass an application such as a database application, media application, office application or any other application that may make use of data transfer resources. In some embodiments, such an application may include sufficient protocol support (e.g., for a suitable version of Hypertext Transfer Protocol (HTTP)) for generating and processing web services requests without necessarily implementing full browser support for all types of web-based data. That is, the client 210 may be an application configured to interact directly with the virtual computing service 230. A client 210 may be configured to generate web services requests according to a Representational State Transfer (REST)-style web services architecture, a document- or message-based web services architecture, or another suitable web services architecture.

In other embodiments, a client 210 may be configured to provide access to web services-based data transfer requests in a manner that is transparent to those applications. For example, the client 210 may be configured to integrate with an operating system or file system to provide data transfer in accordance with a suitable variant of the model described herein. In other embodiments, data transfer between nodes may be initiated by the system itself and invisible to a user of web services or virtual computing services. For example, data transfer may be implemented in the background as a means of managing distributed or redundant data to provide for more robust operation of a web-services based system.

Clients 210a-n may convey service or operational requests to and receive responses from the virtual computing service 230 via the network 220. In various embodiments, the network 220 may encompass any suitable combination of networking hardware and protocols necessary to establish web-based communications between the clients 210a-n and the virtual computing service 230. For example, the network 220 may generally encompass the various telecommunications networks and service providers that collectively implement the Internet. The network 220 may also include private networks such as local area networks (LANs) or wide area networks (WANs) as well as public or private wireless networks. For example, both a given client 210a and the virtual computing service 230 may be respectively provisioned within enterprises having their own internal networks. In such an embodiment, the network 220 may include the hardware (e.g., modems, routers, switches, load balancers, proxy servers, etc.) and software (e.g., protocol stacks, accounting software, firewall/security software, etc.) necessary to establish a networking link between given client 210a and the Internet as well as between the Internet and the virtual computing service 230. It is noted that in some embodiments, the clients 210a-n may communicate with the virtual computing service 230 using a private network rather than the public Internet. For example, the clients 210a-n may be provisioned within the same enterprise as a storage service system (e.g., a system that implements the data store 260). In such a case, the clients 210a-n may communicate with the virtual computing service 230 entirely through a private network (e.g., a LAN or WAN that may use Internet-based communication protocols but which is not publicly accessible).

Generally speaking, the virtual computing service 230 may be configured to implement one or more service endpoints configured to receive and process web services requests, such as requests to encode data or requests to decode data. For example, the virtual computing service 230 may include hardware and/or software configured to implement a particular endpoint, such that an HTTP-based web services request directed to that endpoint is properly received and processed. In one embodiment, the virtual computing service 230 may be implemented as a server system configured to receive web services requests from the clients 210a-n and to forward them to appropriate components or clients of the service. In other embodiments, the virtual computing service 230 may be configured as a number of distinct systems (e.g., in a cluster topology) implementing load balancing and other request management features configured to dynamically manage large-scale web services request processing loads. In various embodiments, the virtual computing service 230 may be configured to support REST-style or document-based (e.g., SOAP-based) types of web services requests.

In addition to functioning as an addressable endpoint for clients' web services requests, in some embodiments, the web services or virtual computing service 230 may implement various client management features. For example, virtual computing service 230 may coordinate the metering and accounting of client usage of web services, including storage resources, such as by tracking the identities of requesting clients 210a—n, the number and/or frequency of client requests, the size of objects stored or retrieved on behalf of clients 210a-n, overall storage bandwidth used by clients 210a-n, class of storage requested by clients 210a-n, or any other measurable client usage parameter. The virtual computing service 230 may also implement financial accounting and billing systems, or may maintain a database of usage data that may be queried and processed by external systems for reporting and billing of client usage activity. In certain embodiments, the virtual computing service 230 may be configured to collect, monitor and/or aggregate a variety of storage service system operational metrics, such as metrics reflecting the rates and types of requests received from the clients 210a-n, bandwidth utilized by such requests, system processing latency for such requests, system component utilization (e.g., network bandwidth and/or storage utilization within the storage service system), rates and types of errors resulting from requests, characteristics of requested objects (e.g., size, data type, etc.), or any other suitable metrics. In some embodiments such metrics may be used by system administrators to tune and maintain system components, while in other embodiments such metrics (or relevant portions of such metrics) may be exposed to the clients 210a-n to enable such clients to monitor data transfer requests and/or another virtual computing service 250 (or the underlying systems that implement those services).

Note that while several examples included herein describe a network or service exposed to external clients, in other embodiments, the data transfer or storage service may be internal to a computing system or an enterprise system and may not be exposed to external clients (e.g., users or client applications). For example, the operating system, a backup process, or another system component may back up a primary storage system (e.g., periodically, automatically or in response to a request to do so) to a separate storage system by transferring data to the backup system in erasure-coded form. In these examples, the "client" of the system may be another application internal to a virtual computing service.

Transmitting node 240 of virtual computing service 230 may include a transmitting application 242, transmission manager 244, or network transmission protocol interface 246 for implementing transmission of data-redundancy-encoded data via an unreliable, connectionless protocol as described herein. According to some embodiments, the functions of transmitting application 242, transmission manager 244, and network transmission protocol interface 246 may be similar or identical to those of transmitting application 122, transmission manager 124, and network transmission protocol interface 128, respectively, as described herein with reference to FIG. 1.

Receiving node 250 of virtual computing service 230 may include a reconstruction manager 254 or network transmission protocol interface 258 for implementing transmission of data-redundancy-encoded data via an unreliable, connectionless protocol as described herein. Receiving node 250 may also include a receiving application (not illustrated at FIG. 2). According to some embodiments, the functions of reconstruction manager 254 and network transmission protocol interface 258 may be similar or identical to those of reconstruction manager 144 and network transmission protocol interface 148, respectively, as described herein with reference to FIG. 1.

Figure 3:
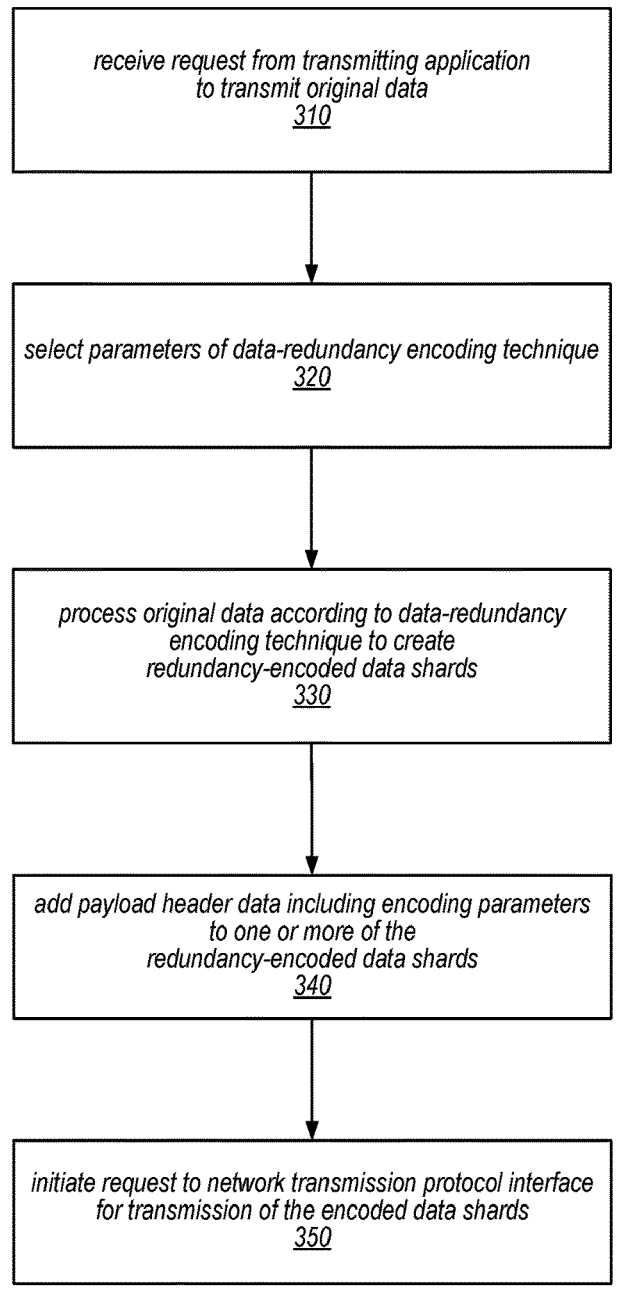
FIG. 3 is a flow diagram illustrating an example embodiment of a method for data-redundancy encoding and transmitting data.

FIG. 3 is a flow diagram illustrating an example embodiment of a method for data-redundancy encoding and transmitting data. According to some embodiments, process 300 may be implemented wholly or in part by a transmission manager, for example transmission manager 124 of FIG. 1.

At step 310 of process 300, the transmission manager receives a request from a transmitting application to transmit original data.

At step 320 of FIG. 3, the transmission manager selects parameters of a data-redundancy encoding technique for encoding the original data to be transmitted. For example, the transmission manager may select parameters based on network conditions such as one or more expected or measured packet or data loss rates or measured or expected latency on a network. These metrics for network conditions may be estimated or calculation using a variety of techniques known to one having ordinary skill in the art, or in some cases observed from previous transmissions on the network, including transmissions of data-redundancy encoded data over the network. In some embodiments, the transmission manager may select parameters of an algorithm based at least in part on characteristics of the data itself, such as the amount or complexity of data to be transferred. In some embodiments, one or more parameters may be preconfigured, for example by an owner or operator of a provider network within which the transfer is to take place. In some embodiments, transmission manager may select among a plurality of pre-defined sets of parameters, for example, sets of parameters representing known, predefined erasure-coding algorithms as may be apparent to one having ordinary skill in the art. Examples of specific parameters that may be selected are discussed further below with respect to FIG. 6.

At step 330 of process 300, the transmission manager processes the original data according to the data-redundancy encoding technique to create redundancy-encoded data shards. In an example embodiment involving applying an erasure coding scheme, the transmission manager may augment original data with redundant data and break the augmented data in to encoded data shards. As explained above, the data shards may represent an augmented version of the original data. The data shards according to some embodiments may be coded according to an erasure coded technique or according to another coding technique. The original data may be reconstructed from a particular number of shards. In some embodiments, the particular number of shards is fewer than a total number of shards representing the encoded data.

At step 340 of process 300, the transmission manager adds payload header data to one or more of the redundancy-encoded data shards. According to some embodiments, the payload header data may include one or more of the selected parameters of the data-redundancy encoding technique. For example, payload header data may include one or more of the selected parameters of a data-redundancy encoding algorithm as described above. In some embodiments, payload header data may include information necessary for decoding data shards to reconstruct original data. For example, payload header data may include information about a total number of shards representing original data, how many shards are needed to reconstruct the original data, sequential numbering of the encoded data shards, or a combination of those elements, in addition to other information.

At step 350 of process 300, the transmission manager initiates a request to a network transmission protocol interface for transmission of the encoded data shards. In various embodiments, a network may encompass any suitable combination of networking hardware and protocols necessary to establish transmission between nodes of provider network. For example, the network may include physical or virtual hardware (e.g., modems, routers, switches, load balancers, proxy servers, etc.) and software (e.g., protocol stacks, accounting software, firewall/security software, etc.) necessary to establish a transmission link between a transmitting node and a receiving node. In some embodiments, various components or nodes of provider network 110 may communicate via a private network (e.g. a LAN or WAN) that is not publicly accessible, but may use known communication protocols including typical internet-based protocols such as TCP/IP or unreliable, connectionless protocols such as UDP.

Figure 4:
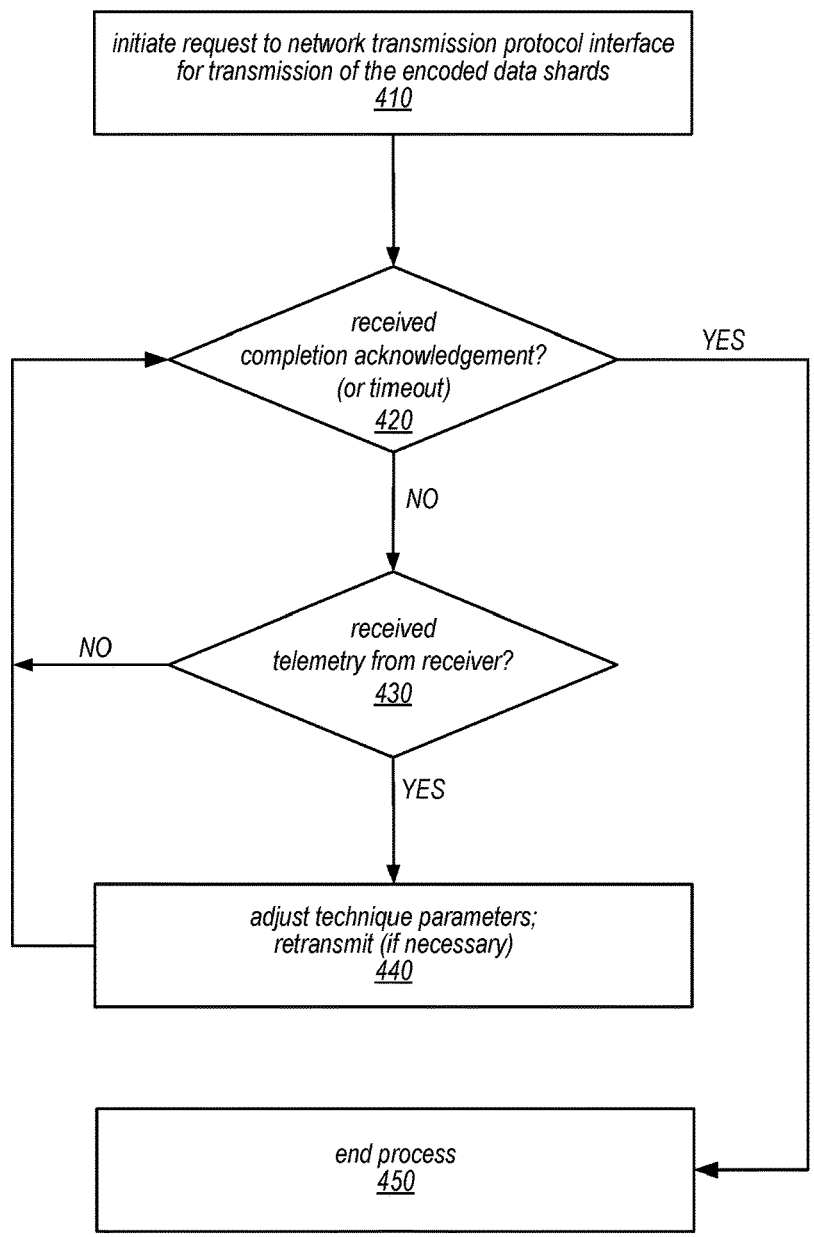
FIG. 4 is a flow diagram illustrating an example embodiment of a method for adjusting parameters of a data-redundancy encoding technique or retransmitting missing shards.

FIG. 4 is a flow diagram illustrating an example embodiment of a method for adjusting parameters of a data-redundancy encoding technique or retransmitting missing shards. According to some embodiments, process 400 may be implemented wholly or in part by a transmission manager, for example transmission manager 124 of FIG. 1. At step 410 of process 400, the transmission manager initiates a request to a network transmission protocol interface for transmission of encoded data shards. This step may be identical in some embodiments to step 350 of FIG. 3 as described above.

At step 420 of process 400, the transmission manager waits to receive a message—for example from a receiving node or reconstruction manager—indicating receipt or other acknowledgement of data shards transmitted. For example, the transmission manager may receive a "FIN/ACK" message indicating, for example, that a receiving node has received all it needs to reconstruct the original data or that it has successfully completed reconstruction of the original data. In some embodiments, a transmission manager may receive messages requesting retransmission of all or some of the shards or other telemetry information relevant to transmission of the encoded shards or the network in general. According to some embodiments, process 400 may proceed directly to its end at step 450 when a "FIN/ACK" or similar acknowledgement is received.

In some embodiments, the payload header data may include information about how the transmission manager will behave with respect to waiting for an acknowledgement or finished message from a receiving node or reconstruction manager. For example, payload header data may indicate a particular time period that a transmission manager will wait for information or acknowledgement before retransmitting shards, abandoning a transmission, or changing encoding parameters.

At step 430, if a "FIN/ACK" or equivalent acknowledgement has not been received—for example after a predefined number of milliseconds—the transmission manager may check to see whether it has received any telemetry data, for example from a receiving node or a reconstruction manager. Telemetry data according to some embodiments may include network latency information, information about dropped packets, requests for retransmission of all or a subset of encoded data shards, requests for specific parameter changes, information on specific transmission events, or other data as will be apparent to one having ordinary skill in the art. If telemetry has been received, control of process 400 passes to step 440. If no telemetry has been received, the process may proceed to another waiting period, for example at step 420. Alternatively, the process may be configured such that if a waiting period has timed out and no telemetry has been received, the process proceeds to end at step 450.

At step 440, if the transmission manager has received telemetry data from a receiving node or reconstruction manager, the transmission manager may adjust one or more parameters of the data-redundancy encoding technique in response to the telemetry data. For example, the transmission manager may adjust a ratio of augmented/encoded data size to original size. Generally, for an erasure coding scheme, a larger percentage may be used for less reliable networks. In some embodiments, a transmission manager may retransmit one or more shards according to telemetry data.

Figure 5:
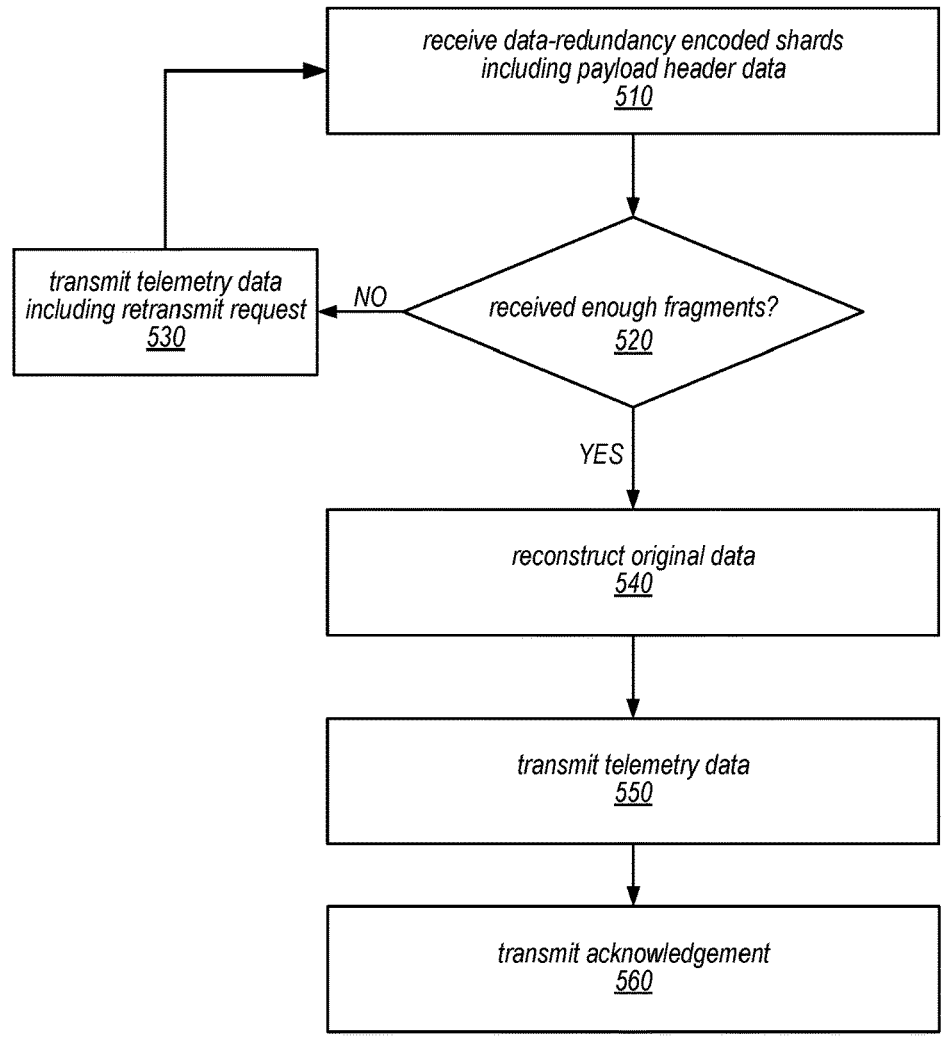
FIG. 5 is a flow diagram illustrating an example embodiment of a method for receiving, processing, and acknowledging data-redundancy encoded data.

FIG. 5 is a flow diagram illustrating an example embodiment of a method for receiving, processing, and acknowledging data-redundancy encoded data. According to some embodiments, process 500 may be implemented wholly or in part by a reconstruction manager, for example reconstruction manager 144 of FIG. 1.

At step 510, the reconstruction manager receives data-redundancy encoded shards and payload header data. For example, payload header data associated with encoded data shards may indicate or allow the reconstruction manager to calculate information such how many total shards there are, how many shards are needed to completely reconstruct a copy of the original data, when a shard was transmitted, information about how the transmission manager will handle errors or retransmissions, how long the transmission manager will wait for acknowledgement from reconstruction manager, etc.

At step 520 according to some embodiments, a reconstruction manager determines—for example, using received payload header data—whether it has received enough fragments or shards to reconstruct the original data. If the reconstruction manager has not received enough shards, it may transmit, at step 530, telemetry data to a transmission manager, including a request to retransmit all or a portion of the shards. According to some embodiments, the reconstruction manager may request specific shards by their sequentially assigned number(s). In some embodiments, the telemetry data may include other information as discussed elsewhere herein.

At step 540, a reconstruction manager reconstructs a copy of the original data. According to some embodiments, the reconstruction manager may apply appropriate decoding techniques depending on the data-redundancy encoding technique used by transmission manager to create the encoded data shards. For example, if data shards are encoded according to an erasure encoding scheme, reconstruction manager may apply a decoding matrix, refinement techniques, and other decoding techniques as would be apparent to one having ordinary skill in the art.

After, before, or during reconstruction of the original data, the reconstruction manager may transmit telemetry data at step 550. For example, the reconstruction manager may transmit telemetry data to a transmission manager including network latency or dropped packet information, information about one or more data loss events, requests for adjustments to parameters of the data-redundancy encoding technique, etc.

At step 560, the reconstruction manager may transmit an acknowledgement or finished message—for example, a "FIN/ACK" message—to the transmission manager, which may signal that it has received a sufficient number of shards and/or completed reconstruction of the original data.

FIG. 6 is a table showing example payload header data that may be used to implement transmission of data-redundancy encoded data. The example table of FIG. 6, may be implemented, for example, as a pseudoheader of a UDP packet carrying one or more encoded data shards as described herein. One of ordinary skill in the art will appreciate that all or a subset of the rows of FIG. 6 may be included as payload header data to implement the systems and methods described herein. Similarly, additional information may be included, and formatting may change, for example when implementing unreliable, connectionless transmission protocols other than UDP or to suit the formatting of a particular protocol stack or network broadcast stream.

Row 610 of FIG. 6 includes a parameter that indicates a name for the type of source. A corresponding value according to some embodiments may include a bit array for the type of source, for example IPv4/mask, IPv6/Mask, FQDN, or other appropriate sources as one having ordinary skill in the art will appreciate. Row 620 of FIG. 6 includes a source field to contain as its value a source host identifier, for example IPv4, IPv6, or FQDN hostname, or other appropriate host identifiers as one having ordinary skill in the art will appreciate.

Row 630 according to some embodiments includes a length, in bytes of the total erasure-coded message (the total size of all shards). In some embodiments, the value of row 630 may be represented as "n." Row 640 according to some embodiments includes a length in bytes of the message before erasure coding (the total size of the original data). In some embodiments, the value of row 640 may be represented as "m."

Row 650 according to some embodiments may include an integer representing the total number of erasure-coded shards—for example, the number of the last shard in the encoded data, where the shards are numbered sequentially.

Row 660 according to some embodiments may include a ratio of the size of the encoded data versus the size of the original data, or "n/m". Generally, a higher ratio may be used for less reliable networks. For example, a ratio of 110% may be used for a particularly low-latency and low-packet-loss connection, while a ratio of 125% may be considered more efficient for a slightly less reliable network in order to reduce the need for extra overhead in retransmitting entire shards.

Row 670 according to some embodiments includes a time the sender (transmission manager) will wait for an acknowledgement message such as a "FIN/ACK" before resending data or taking other action, according to the specific configuration of the transmission manager and other parameters. In some embodiments, a receiver may be configured not to bother sending an acknowledgement or other message after expiration of the wait time variable. The value of row 670 may be expressed, for example, in milliseconds or another suitable unit of time according to the particular requirements of a system, as will be apparent to one having ordinary skill in the art.

Row 680 includes a time stamp of when the data was sent. For example, in some embodiments, row 680 may include a system time of a transmitting application of the transmitting application's initial request to transmit the original data. In other embodiments, row 680 may include a timestamp of a transmission manager's request to a network transmission protocol interface, or a timestamp of the actual transmission time of one or more shards.

Figure 7:
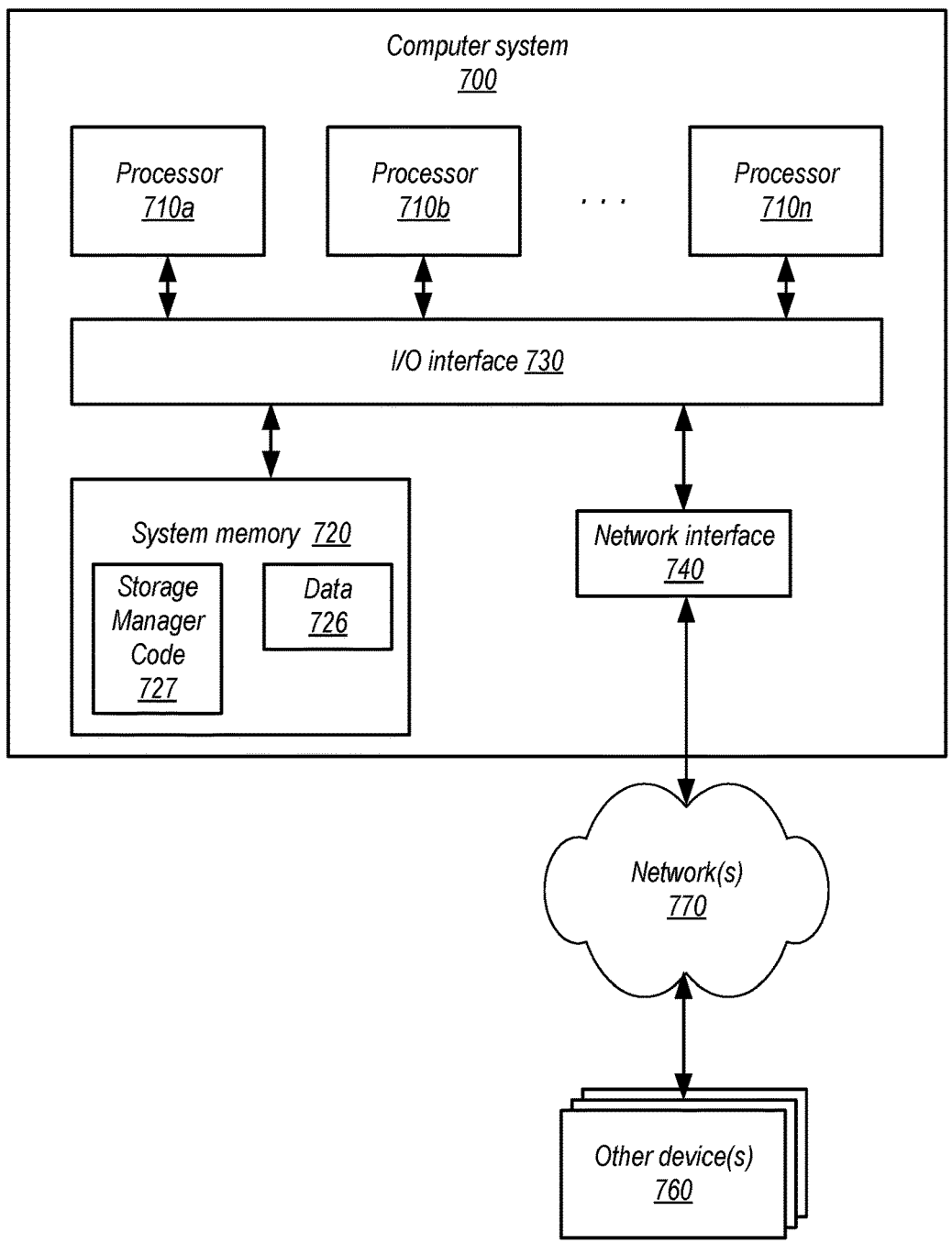
FIG. 7 is a block diagram illustrating one embodiment of a computer system configured to implement at least a portion of a storage manager, as described herein.

One embodiment of a computer system configured to implement at least a portion of data-redundancy-encoded data via an unreliable, connectionless protocol 67 is shown in FIG. 7. In at least some embodiments, a server that implements a portion or all of the methods and apparatus for encoding, transmitting, and reconstructing data as described herein may include a general-purpose computer system that includes or is configured to access one or more computer-accessible media, such as a computer system 700 illustrated in FIG. 7. In the illustrated embodiment, the computer system 700 includes one or more processors 710*a-n* coupled to a system memory 720 via an input/output (I/O) interface 730. The computer system 700 further includes a network interface 740 coupled to the I/O interface 730.

In various embodiments, the computer system 700 may be a uniprocessor system including one processor 710*a*, or a multiprocessor system including several processors 710*a-n* (e.g., two, four, eight, or another suitable number). The processors 710*a-n* may be any suitable processors capable of executing instructions. For example, in various embodiments, the processors 710*a-n* may be general-purpose or embedded processors implementing any of a variety of instruction set architectures (ISAs), such as the x86, PowerPC, SPARC, or MIPS ISAs, or any other suitable ISA. In multiprocessor systems, each of the processors 710*a-n* may commonly, but not necessarily, implement the same ISA.

System memory 720 may be configured to store instructions and data accessible by the processor(s) 710. In various embodiments, the system memory 720 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing one or more desired functions, such as those methods, techniques, and data described above for transfer of erasure-coded data, are shown stored within the system memory 720 as storage manager code 727 and data 726.

In one embodiment, the I/O interface 730 may be configured to coordinate I/O traffic between a processor 710, the system memory 720, and any peripheral devices in the device, including the network interface 740 or other peripheral interfaces. In some embodiments, the I/O interface 730 may perform any necessary protocol, timing or other data transformations to convert data signals from one component (e.g., the system memory 720) into a format suitable for use by another component (e.g., a processor 710). In some embodiments, the I/O interface 730 may include support for devices attached through various types of peripheral buses, such as a variant of the Peripheral Component Interconnect (PCI) bus standard or the Universal Serial Bus (USB) standard, for example. In some embodiments, the function of the I/O interface 730 may be split into two or more separate components, such as a north bridge and a south bridge, for example. Also, in some embodiments some or all of the functionality of the I/O interface 730, such as an interface to the system memory 720, may be incorporated directly into a processor 710.

The network interface 740 may be configured to allow data to be exchanged between the computer system 700 and other devices 760 attached to a network or networks 770, such as other computer systems or devices as illustrated or described in FIGS. 1 through 6, for example. In various embodiments, the network interface 740 may support communication via any suitable wired or wireless general data networks, such as types of Ethernet network, for example. Additionally, the network interface 740 may support communication via telecommunications/telephony networks such as analog voice networks or digital fiber communications networks, via storage area networks such as Fibre Channel SANs, or via any other suitable type of network and/or protocol.

In some embodiments, the system memory 720 may be one embodiment of a computer-accessible medium configured to store program instructions and data as described above for FIGS. 1 through 5 for implementing embodiments of data-redundancy-encoded data via an unreliable, connectionless protocol. However, in other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to the computer system 700 via the I/O interface 730. A non-transitory computer-accessible storage medium may also include any volatile or non-volatile media such as RAM (e.g. SDRAM, DDR SDRAM, RDRAM, SRAM, etc.), ROM, etc., that may be included in some embodiments of the computer system 700 as the system memory 720 or another type of memory. Further, a computer-accessible medium may include transmission media or signals such as electrical, electromagnetic, or digital signals, conveyed via a communication medium such as a network and/or a wireless link, such as may be implemented via the network interface 740.

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc., as well as transmission media or signals such as electrical, electromagnetic, or digital signals, conveyed via a communication medium such as network and/or a wireless link.

The various methods as illustrated in the Figures and described herein represent exemplary embodiments of methods. The methods may be implemented in software, hardware, or a combination thereof. The order of method may be changed, and various elements may be added, reordered, combined, omitted, modified, etc.

Various modifications and changes may be made as would be obvious to a person skilled in the art having the benefit of this disclosure. It is intended to embrace all such modifications and changes and, accordingly, the above description to be regarded in an illustrative rather than a restrictive sense.

What is claimed is:

1. A system, comprising:
a network comprising a plurality of computer systems;
a transmitting application implemented by one or more hardware processors of the plurality of computer systems and configured to request transmission of original data of the transmitting application via a network;
a network transmission protocol interface implemented by one or more hardware processors of the plurality of computer systems;
a transmission manager implemented by one or more hardware processors of the plurality of computer systems and configured to:
receive a request, from the transmitting application, to transmit the original data of the transmitting application;
select, based at least in part on one or more network conditions, at least one of a plurality of parameters of a data-redundancy encoding technique for encoding the original data prior to transmission;
encode the original data according to the data-redundancy encoding technique to create encoded data, the encoded data comprising a plurality of shards, such that the original data can be reconstructed from a particular number of shards that is fewer than a total number of shards associated with the original data;
add payload header data to one or more of the shards of the encoded data, the payload header data comprising at least one of the plurality of parameters of the data-redundancy encoding technique; and
initiate a request to the network transmission protocol interface for transmission of the encoded data via an unreliable, connectionless transmission protocol.

2. The system of claim 1, wherein the transmitting application specifies, in the request to transmit the original data, that the transmission be accomplished using data-redundancy encoding.

3. The system of claim 1, wherein the transmission manager is further configured to adjust at least one of the plurality of parameters in response to one or more of:
a rate of loss of transmitted shards of the encoded data;
a number of shard retransmission requests received from a receiving application; or
latency information of a network associated with the transmitting application.

4. The system of claim 1, further comprising a reconstruction manager of a receiving application, the reconstruction manager configured to:
receive the encoded data, including the payload header data;
reconstruct the original data using information of the encoded data and the payload header data; and
transmit, to transmission manager, an acknowledgement that the reconstruction manager has successfully reconstructed the original data.

5. A method, comprising:
receiving, at a transmission manager implemented by one or more hardware processors, a request from a transmitting application to transmit original data of the transmitting application;
selecting, by the transmission manager, at least one of a plurality of parameters of a data-redundancy encoding technique in response to at least one network condition;
encoding, by the transmission manager, the original data according to the data-redundancy encoding technique to create encoded data, the encoded data comprising a plurality of shards, such that the original data can be reconstructed from a particular number of shards that is fewer than a total number of shards associated with the original data; and
initiating, by the transmission manager, a request to a network transmission protocol interface to transmit the encoded data via a network.

6. The method of claim 5, wherein the method is performed within an application space of an execution environment associated with the network.

7. The method of claim 5, wherein initiating a call to transmit the encoded data comprises requesting transmission via an unreliable, connectionless transmission protocol of the network.

8. The method of claim 5, wherein the transmitting application specifies, in the request to transmit the original data, that the transmission be accomplished using data-redundancy encoding.

9. The method of claim 5, further comprising adding payload header data to one or more shards of the encoded data, the payload header data comprising at least one of the plurality of parameters of the data-redundancy encoding technique.

10. The method of claim 5, wherein a receiving application has not received enough shards of the encoded data to reconstruct the original data, the method further comprising:
receiving, by the transmission manager, a request from the receiving application to retransmit one or more particular shards of the encoded data; and initiating, by the transmission manager, a request to the network transmission protocol interface to retransmit the one or more particular shards of the encoded data via the network.

11. The method of claim 5, wherein one or more shards of the encoded data is received at a receiving application, and wherein the transmitting application and receiving application are associated with separate computing devices of a provider network.

12. The method of claim 5, wherein a receiving application has received one or more shards of the encoded data, the method further comprising:
adjusting, by the transmission manager, at least one of the plurality of parameters of the data-redundancy encoding technique in response to telemetry information received from the receiving application.

13. The method of claim 5, wherein a receiving application has received one or more shards of the encoded data, the method further comprising:
receiving, by the transmission manager, an indication that the receiving application did not receive enough of the shards of the encoded data to reconstruct the original data.

14. The method of claim 5, wherein selecting at least of a plurality of parameters of a data-redundancy encoding technique comprises selecting among a plurality of pre-defined erasure-coding schemes.

15. The method of claim 5, wherein the at least one network condition comprises at least one of:
an expected packet loss rate;
a measure of packets lost on the network; or
a measure of latency on the network.

16. A non-transitory, computer-readable medium storing program instructions that when executed on one or more computers cause the one or more computers to implement a transmission manager, the transmission manager configured to:
receive a request from a transmitting application to transmit original data of the transmitting application;
select at least one of a plurality of parameters of a data-redundancy encoding technique in response to at least one network condition;
encode the original data according to the data-redundancy encoding technique to create encoded data, the encoded data comprising a plurality of shards, such that the original data can be reconstructed from a particular number of shards that is fewer than a total number of shards associated with the original data;
adding payload header data to one or more of the shards of the encoded data, the payload header data comprising at least one of the plurality of parameters of the data-redundancy encoding technique; and
initiate a request to a network transmission protocol interface for transmission of the encoded data.

17. The non-transitory, computer-readable medium of claim 16, wherein the request by the transmitting application to transmit the original data is made via a standard transmission library of the network.

18. The non-transitory, computer-readable medium of claim 16, wherein the program instructions are further configured to cause the transmission manager to:
receive a request from a receiving application of the transmitted encoded data to retransmit one or more particular shards of the encoded data; and
initiate a request to the network transmission protocol interface to retransmit the one or more particular shards of the encoded data.

19. The non-transitory, computer-readable medium of claim 16, wherein initiating a request to the network transmission protocol interface for transmission of the encoded data comprises requesting transmission via an unreliable, connectionless transmission protocol of the network.

20. The non-transitory, computer-readable medium of claim 16, wherein the data-redundancy encoding technique comprises an erasure coding algorithm.

* * * * *